US008947664B2

(12) United States Patent
Campidell et al.

(10) Patent No.: US 8,947,664 B2
(45) Date of Patent: Feb. 3, 2015

(54) APPARATUS AND METHOD FOR ALIGNING A WAFER'S BACKSIDE TO A WAFER'S FRONTSIDE

(75) Inventors: Josef Campidell, Villach (AT); Thomas Bitzer, Villach (AT); Horst Kittner, Klagenfurt (AT)

(73) Assignee: Infineon Technologies AG, Neubiberg (DE)

( * ) Notice: Subject to any disclaimer, the term of this patent is extended or adjusted under 35 U.S.C. 154(b) by 825 days.

(21) Appl. No.: 12/646,635

(22) Filed: Dec. 23, 2009

(65) Prior Publication Data

US 2011/0149062 A1  Jun. 23, 2011

(51) Int. Cl.
| | |
|---|---|
| G01B 11/00 | (2006.01) |
| H04N 7/18 | (2006.01) |
| G01J 5/00 | (2006.01) |
| G01J 5/02 | (2006.01) |
| G03F 9/00 | (2006.01) |

(52) U.S. Cl.
CPC ................ *H04N 7/18* (2013.01); *G01J 5/0003* (2013.01); *G01J 5/02* (2013.01); *G01J 5/0275* (2013.01); *G03F 9/7069* (2013.01); *G03F 9/7084* (2013.01); *G03F 9/7088* (2013.01); *G01J 5/0007* (2013.01)
USPC .......................................................... 356/401

(58) Field of Classification Search
None
See application file for complete search history.

(56) References Cited

U.S. PATENT DOCUMENTS

| | | | |
|---|---|---|---|
| 3,588,347 A | | 6/1971 | Montone et al. |
| 4,595,295 A | * | 6/1986 | Wilczynski .................. 356/401 |
| 4,704,027 A | * | 11/1987 | Phillips ........................... 355/43 |
| 4,880,309 A | * | 11/1989 | Wanta ............................. 356/401 |
| 5,106,432 A | * | 4/1992 | Matsumoto et al. .......... 148/33.2 |
| 5,361,132 A | * | 11/1994 | Farn ................................ 356/509 |
| 5,446,542 A | * | 8/1995 | Muraoka ........................ 356/400 |
| 5,452,090 A | * | 9/1995 | Progler et al. ................. 356/401 |
| 5,477,057 A | * | 12/1995 | Angeley et al. ............... 250/548 |
| 5,604,354 A | * | 2/1997 | Lauverjat ....................... 250/548 |
| 6,180,498 B1 | * | 1/2001 | Geffken et al. ............... 438/462 |
| 6,528,219 B1 | * | 3/2003 | Conrad et al. .................. 430/22 |

(Continued)

FOREIGN PATENT DOCUMENTS

| | | |
|---|---|---|
| DE | 3642391 A1 * | 6/1988 |
| EP | 1285879 A2 * | 2/2003 |
| JP | 2000182914 A * | 6/2000 |

OTHER PUBLICATIONS

"Scattered Light Feedback Detector for Automatic Wafer Alignment," Jul. 1975, pp. 414-415, vol. 18, Issue 2, IBM Technical Disclosure Bulletin, US.*

*Primary Examiner* — Gordon J Stock, Jr.
(74) *Attorney, Agent, or Firm* — Slater & Matsil, L.L.P.

(57) ABSTRACT

Structures of a backside of a wafer can be aligned to structures of a frontside of the wafer for a lithographic treatment of the backside. The wafer is transparent for electromagnetic radiation of a specific wavelength. The wafer is placed on a wafer stage such that the frontside is facing the wafer stage and the backside is facing alignment optics. The backside is illuminated with electromagnetic radiation of the specific wavelength in a dark-field configuration, such that the electromagnetic radiation propagates through the wafer towards three-dimensional structures of a three-dimensional alignment target located at the frontside or inside the wafer and is scattered at the three-dimensional structures. The scattered electromagnetic radiation is captured with the alignment optics, and the backside is aligned to the frontside of the wafer based on the scattered electromagnetic radiation.

18 Claims, 5 Drawing Sheets

(56) References Cited

U.S. PATENT DOCUMENTS

| | | | |
|---|---|---|---|
| 6,630,746 B1* | 10/2003 | Mancini et al. | 257/797 |
| 6,842,538 B2* | 1/2005 | Lee et al. | 382/224 |
| 7,268,877 B2* | 9/2007 | Stacker | 356/401 |
| 7,528,937 B1* | 5/2009 | Crespin et al. | 355/75 |
| 2003/0032299 A1* | 2/2003 | Ouellet | 438/719 |
| 2005/0231713 A1* | 10/2005 | Owen et al. | 356/237.1 |
| 2006/0035159 A1* | 2/2006 | Best et al. | 430/22 |
| 2006/0072096 A1* | 4/2006 | Chandhok | 355/67 |
| 2007/0020871 A1* | 1/2007 | Chen et al. | 438/401 |
| 2007/0242271 A1* | 10/2007 | Moon | 356/401 |
| 2008/0106738 A1* | 5/2008 | Kim | 356/399 |
| 2008/0157407 A1* | 7/2008 | Chen et al. | 257/797 |
| 2008/0292177 A1* | 11/2008 | Sheets et al. | 382/151 |
| 2009/0153825 A1* | 6/2009 | Edart et al. | 355/67 |
| 2009/0310113 A1* | 12/2009 | Musa et al. | 355/70 |
| 2010/0195102 A1* | 8/2010 | Den Boef | 356/401 |
| 2013/0070226 A1* | 3/2013 | Van Haren et al. | 355/67 |

* cited by examiner

APPARATUS AND METHOD FOR ALIGNING A WAFER'S BACKSIDE TO A WAFER'S FRONTSIDE

TECHNICAL FIELD

Embodiments of the present invention relate to a concept for aligning structures of a wafer's backside to respective structures of its frontside, wherein the concept may be applied for a lithographic treatment of the wafer.

BACKGROUND

During fabrication of integrated circuits (ICs), typically a plurality of layers are deposited on a substrate, particularly a semiconductor substrate, and are patterned and/or etched to form an integrated circuit or a plurality of integrated circuits which have to be diced afterwards. For the fabricated ICs to work properly, it is important that each circuit layer is aligned with a previously formed circuit layer or layers, at least within some permissible fabrication tolerance.

SUMMARY

Embodiments of the present invention provide a method for aligning structures of a wafer's backside to structures of a wafer's frontside for a lithographic treatment of the backside, wherein the wafer is transparent for electromagnetic radiation of a specific wavelength. The method includes placing the wafer on a wafer stage such that the frontside is facing the wafer stage and the backside is facing alignment optics. The wafer's backside is illuminated with electromagnetic radiation of a specific wavelength in a dark-field configuration, such that the electromagnetic radiation propagates through the wafer and is scattered at three-dimensional structures of a three-dimensional alignment target located at the frontside or inside the wafer. The scattered electromagnetic radiation is captured with the alignment optics and, in response to the scattered electromagnetic radiation, the wafer's backside is aligned to the wafer's frontside.

BRIEF DESCRIPTION OF THE DRAWINGS

Embodiments of the present invention will be explained in detail with reference to the accompanying drawings, in which.

DETAILED DESCRIPTION

In semiconductor manufacturing, processing steps for fabricating a semiconductor device, e.g., an IC, involve exposing a substrate, such as a semiconductor wafer coated with photosensitive material, using a lithographic exposure system. This exposure requires aligning the substrate residing on a substrate stage or chuck to a reticle having a pattern of a particular device layer and residing on a reticle stage. To perform alignment, the lithographic system includes an alignment system. After alignment, the reticle is exposed to radiation to which the photosensitive coating is sensitive, to transfer the reticle pattern onto the wafer. This alignment and exposure can be performed on a variety of lithography systems such as step and repeat, projection, contact and proximity systems, for example. Typically, the first of such device layers is aligned to some marking on the wafer, e.g., to a flat or notch. Subsequent layers may then be aligned relative to this first layer and/or to each other through the use of alignment marks or alignment targets printed in a kerf region, i.e., the region in a wafer designated to be destroyed during chip dicing. Typical two-dimensional alignment marks include chevrons, squares, crosses and grouped lines of various orientation.

Figure 1A:
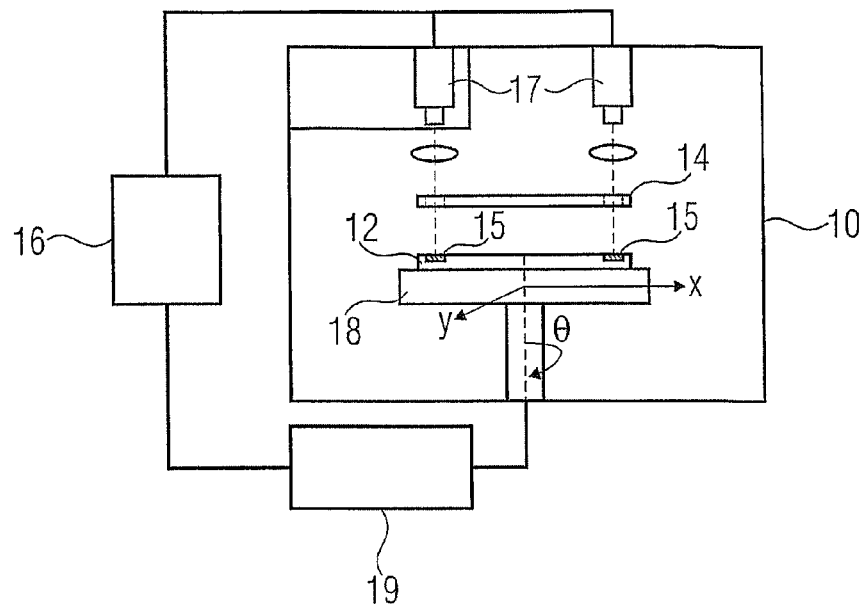
FIG. 1a schematically shows a prior art photolithographic stepper for optically sensing frontside alignment markers on a wafer.

Referring to FIG. 1a, to align a plurality of circuit layers, a semiconductor substrate 12 having a photo-resist applied thereon (not shown) is placed in a photolithographic chamber 10, which may be also referred to as a "stepper" or "scanner". In the stepper 10, a mask or reticle 14 is used to pattern the photo-resist. As the patterned photo-resist automatically dictates the positioning of an underlining circuit layer to be etched, its alignment is extremely critical. To bring the substrate 12 into alignment with the reticle 14, an image of some structure on the reticle and an alignment target 15 on the wafer 12 are compared using optical analysis equipments, with such images being received by alignment optics or optical sensors 17. If alignment is needed, the optical analysis equipment 16 can control the positioning of a wafer stage or chuck 18 on which the substrate or wafer 12 sits by motor stages 19, which, e.g., can move the chuck 18 along the X-axis, Y-axis or the rotational θ-axis as appropriate. Such alignment is usually assessed at numerous locations around the wafer's perimeter, which, accordingly, requires reference to one or a plurality of alignment structures 15 on the wafer 12.

Although alignment structures 15 can constitute an actual active portion of the integrated circuit being fabricated, a dedicated inactive structure is usually formed for this purpose. This can be referred to as an alignment marker or target. Typically, such alignment markers 15 are formed outside of the active integrated circuit area on the wafer 12, i.e., in the kerf region in which the wafer 12 will be diced for a later separation into semiconductor packages.

In some lithographic applications a three-dimensional nature of the device being produced requires precise alignment of the structure of the frontside through to the backside of the substrate or the wafer. In certain cases, the substrate is processed on one side, and then flipped over and processed on the opposite side to create the desired three-dimensional structure. In such cases, frontside and backside alignment must be performed to ensure that a resulting three-dimensional structure is properly aligned. For example, if there is a contact running through from top to bottom sides of the substrate, it must be precisely aligned to the other elements in the device such that it can provide the necessary electrical contact.

Figure 1B:
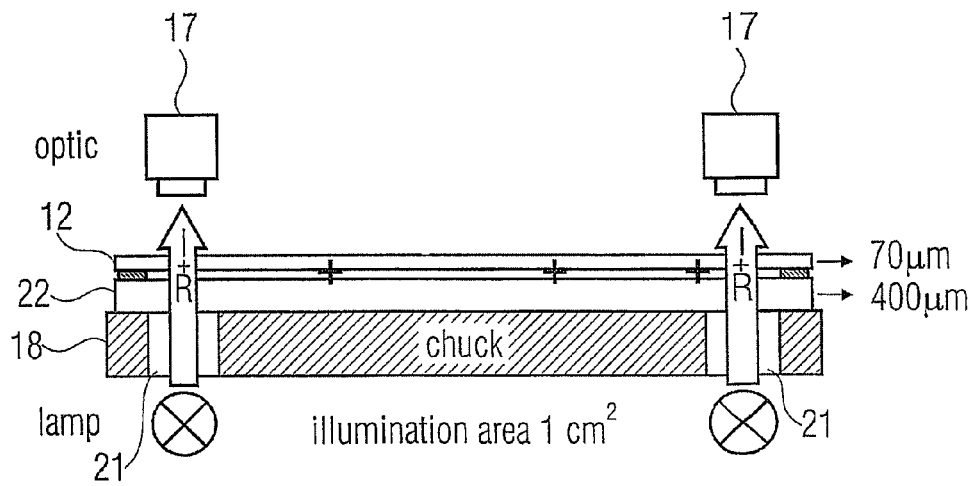
FIG. 1b schematically shows a further prior art photolithographic stepper for optically sensing backside alignment markers on a wafer.

However, alignment markers appearing on the frontside of the wafer 12 suffer from the problem that such markers may typically not at all or not easily be seen from the backside when the wafer has been flipped over and the frontside is facing the chuck 18. A conventional set-up for aligning a wafer's backside to the wafer's frontside (front-to-backside alignment) is schematically shown in FIG. 1b.

The wafer 12 is placed on a glass substrate 22 in between the chuck 18 and the wafer 12, wherein the wafer's frontside is facing the chuck 18 of the stepper. The wafer chuck 18 comprises holes 21 in the bottom of the chuck 18, the holes 21 being aligned with positions of the alignment marks 15 positioned at the frontside of the wafer 12. Infra-red light is used to illuminate the frontside alignment marks 15 through the holes 21 such that they may be visible from the wafer's backside, as semiconductor materials, such as silicon, are transparent to infra-red light. Here, an infra-red video system is required to view the infra-red radiation, but alignment takes place in essentially the same manner as in the case of front-to-front alignment (FIG. 1a), except that the alignment marks 15 viewed from the backside are on the frontside of the wafer 12, viewed through the wafer 12.

To date, wafer front-to-backside alignment has not been possible with steppers working according to the principle of FIG. 1a. Therefore, specially designed steppers according to FIG. 1b have to be employed, wherein the front-to-backside alignment is done, e.g., with illumination with infra-red light passing through the wafer from the front to the backside. The purchase of those designated steppers, however, requires a significant additional financial investment if steppers according to the principle of FIG. 1a are already installed. Further, it is questionable if an alignment with infra-red light passing through the wafer 12 would have a precision of less than 10 μm in the case of wafers 12, which are mounted on glass carriers 22.

Therefore, embodiments of the present invention provide an efficient and cost-saving wafer front-to-backside alignment concept for steppers designed for front-to-front alignment according to the principle of FIG. 1a.

Figure 2:
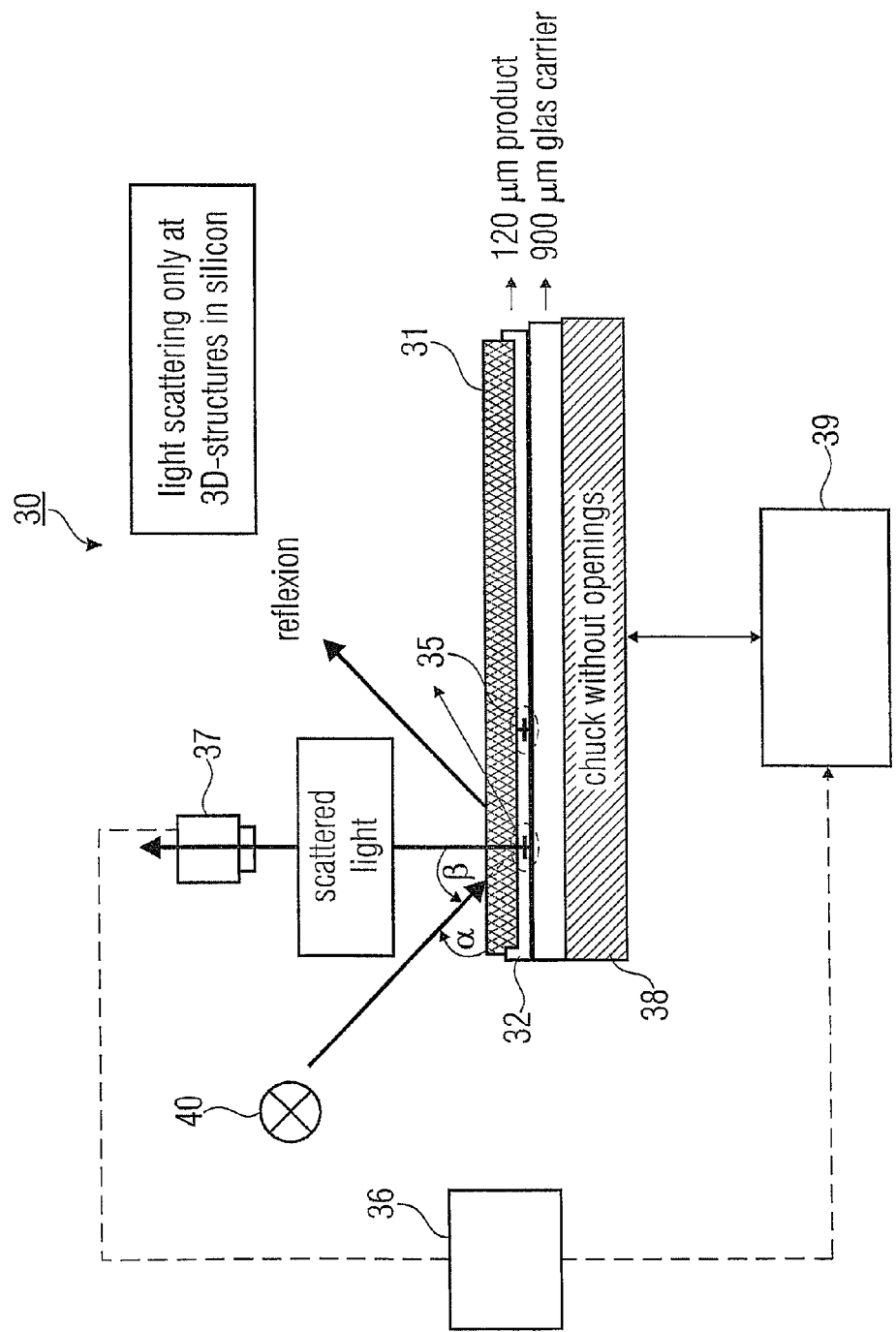
FIG. 2 shows an apparatus for aligning structures of a wafer's backside to structures of the wafer's frontside, according to an embodiment of the present invention.

FIG. 2 shows, according to an embodiment of the present invention, an apparatus 30 for aligning structures of a backside 31 of a wafer 32 to the structures of a frontside of the wafer 32 for a lithographic treatment of the wafer's backside. Thereby, the wafer 32 is transparent for the electromagnetic radiation of a specific wavelength λ.

The apparatus 30 comprises alignment optics 37 for capturing three-dimensional (3D) alignment targets 35 positioned at the frontside of or inside the wafer. The apparatus 30 further includes a wafer stage or chuck 38 for carrying the wafer 32 such that the frontside of the wafer is facing the chuck 38 and such that the backside of the wafer 32 is facing the alignment optics 37. In addition, a radiation source 40 is foreseen, for illuminating the wafer's backside with electromagnetic radiation of a specific wavelength λ in a dark field configuration, such that electromagnetic radiation propagates through the wafer 32 until it is scattered at 3D structures of a 3D alignment target 35 located at the frontside of or inside the wafer 32. For example, the radiation source 40, the alignment optics 37 and the wafer 32 with its 3D alignment target 35 are placed relative to each other, such that the wafer's backside is illuminated with the electromagnetic radiation in the dark field configuration and, such that the scattered electromagnetic radiation may be detected by the alignment optics 37. Further, the apparatus comprises means 36, 39 for aligning the structures of the backside to the structures of the frontside of the wafer 32 based on the scattered electromagnetic radiation captured with the alignment optics 37.

Although not explicitly shown, the alignment of the wafer 32 takes place relative to a reticle having a pattern of a particular device layer and residing on a reticle stage between the wafer 32 and the alignment optics 37. For this reason, the alignment optics 37 may be coupled to an optical analysis equipment 36 which can control the positioning of the wafer stage or chuck 38 on which the substrate or wafer 32 sits by motor stages 39, which, e.g., can move the chuck 38 along the X-axis, Y-axis or the rotational θ-axis as appropriate.

Figure 3:
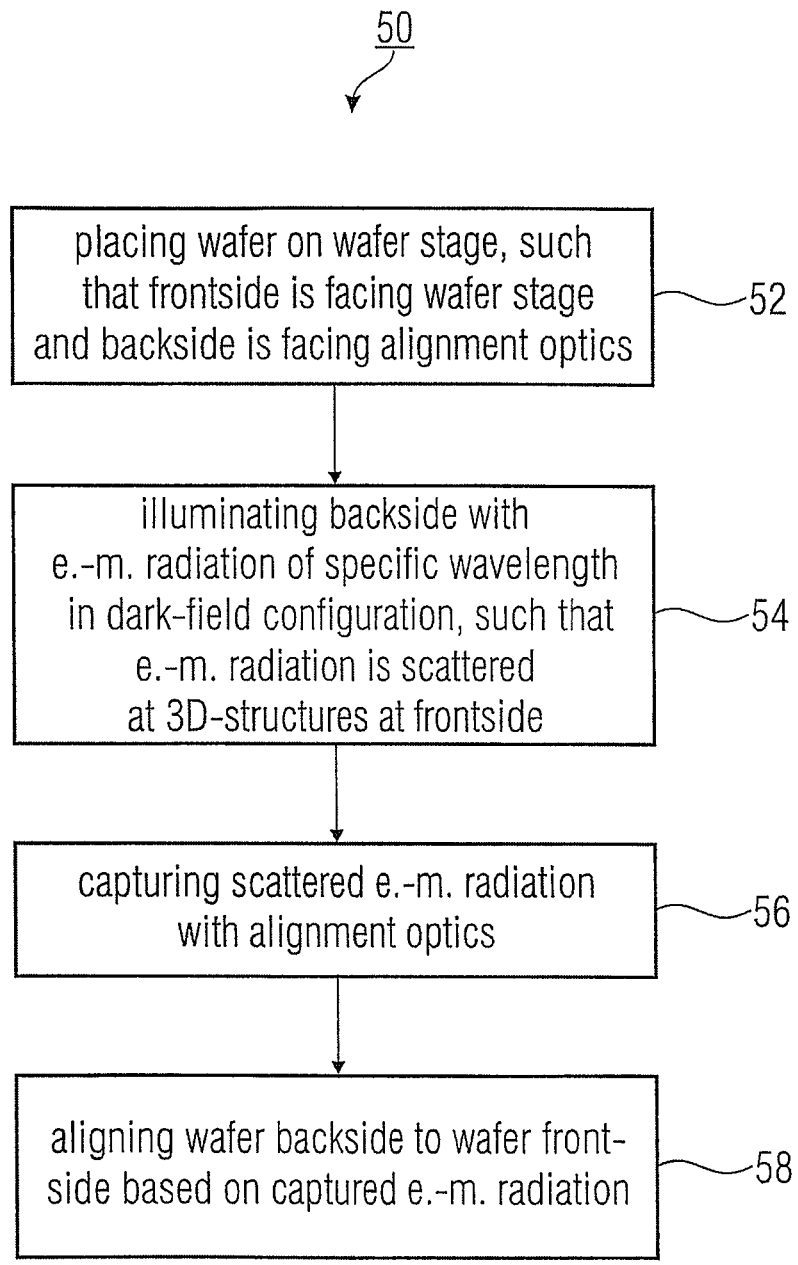
FIG. 3 shows a flow chart of a method for aligning structures of a wafer's backside to structures of a wafer's front side according to an embodiment of the present invention.

According to embodiments of the present invention, the apparatus 30 described with reference to FIG. 2 is adapted to carry out a method 50 for aligning structures of a wafer's backside to the structures of the wafer's frontside for a lithographic treatment. An embodiment of the method 50 will be described with reference to FIG. 3.

The method 50 comprises a step 52 of placing the wafer 32 on the wafer stage 38 such that the wafer's frontside is facing the wafer stage 38 and the wafer's backside is facing the alignment optics 37 having at least a part of the wafer's backside in its field of vision. In a step 54, the wafer's backside is illuminated, in a dark-field configuration, with electromagnetic radiation of the specific wavelength λ for which the wafer 32 is transparent to, such that the electromagnetic radiation propagates through the wafer 32 to the 3D structures of the 3D alignment target 35 at the frontside or inside the wafer 32 and is scattered at this 3D structure. Then, in step 56, the scattered electromagnetic radiation is captured with the alignment optics 37, which is located above the wafer's backside, and the wafer's backside is aligned (step 58) to the wafer's frontside based on the scattered and captured electromagnetic radiation.

Figure 4:
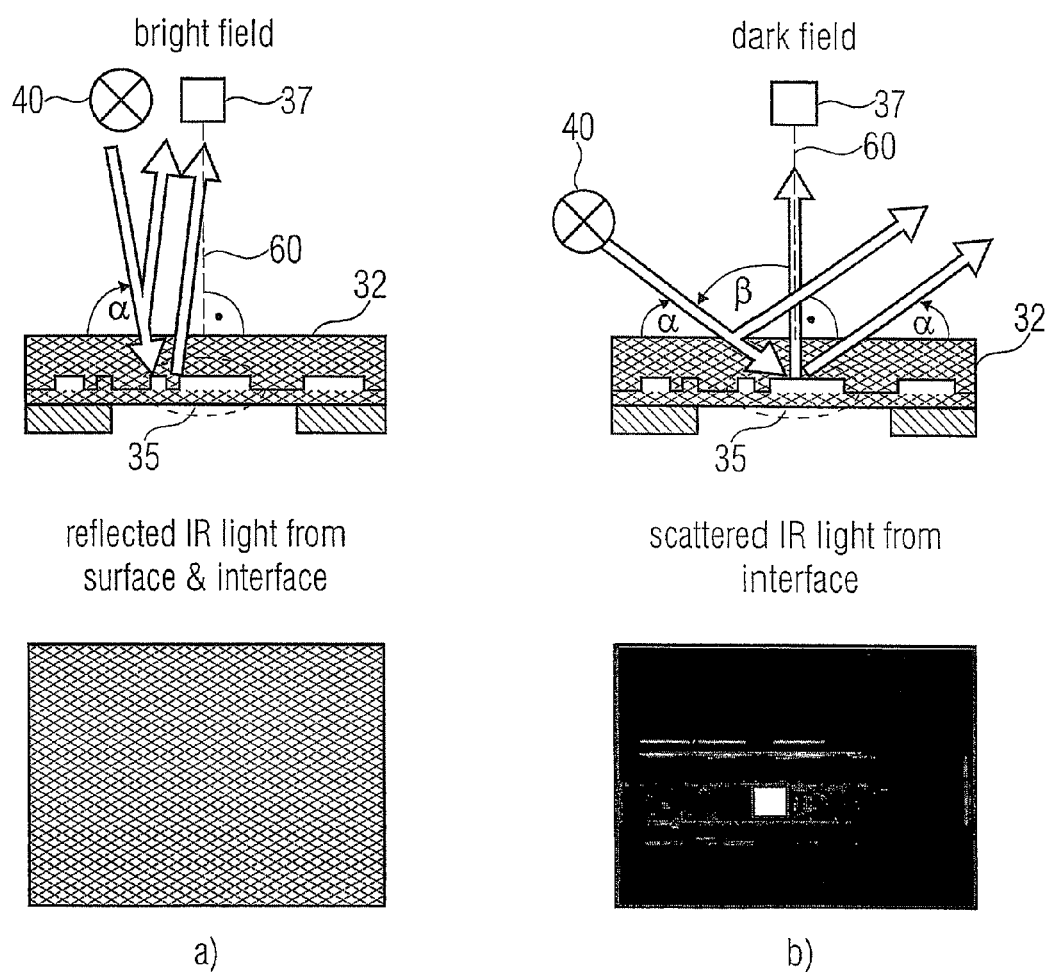
FIG. 4a schematically shows a bright-field illumination of a wafer.
FIG. 4b schematically shows a dark-field illumination of a wafer, according to an embodiment of the present invention.

In the dark-field configuration the unscattered electromagnetic radiation is excluded from the image obtained via the alignment optics 37. Dark-field is obtained by illuminating the wafer's backside with electromagnetic radiation that will not be collected by the alignment optics 37, and thus will not form part of the resulting image. This produces an appearance of a dark, almost black, background with bright objects on it (FIG. 4b). For the dark-field configuration, step 54 of illuminating the wafer's backside includes illuminating the wafer's backside or, to be more exact, the alignment target 35, in an oblique angle α relative to a plane defined by the wafer 32 (or the wafer's backside) placed on the wafer stage 38 such that essentially no electromagnetic radiation reflected from the wafer 32 reaches the alignment optics 37. In other words, the radiation source 40, the alignment optics 37 and the wafer 32 with its 3D alignment target 35 are placed relative to each other, such that the wafer's backside is illuminated with the electromagnetic radiation in the dark field configuration, and such that only the scattered electromagnetic radiation may be detected by the alignment optics 37. According to some embodiments of the present invention, this may be achieved when the oblique angle α for illuminating at the alignment target 35 with the radiation source 40 is chosen in the range of 5° to 80°. In particular, the oblique angle α may be 45° or close to 45°, e.g., in the range of 45°±10°.

The difference between the dark-field configuration, used according to embodiments of the present invention, and a bright-field configuration shall be explained in more detail referring to FIGS. 4a and 4b.

FIG. 4a illustrates an illumination of the wafer's backside with electromagnetic radiation of the specific wavelength λ in the bright-field configuration, i.e., such that the electromagnetic radiation is reflected at the three-dimensional structures of the 3D alignment target 35 located at the frontside or inside of the wafer 32 into the field of vision of the alignment optics 37. In this case, the illumination angle α relative to the plane defined by the wafer 32 is close to 90°, such that the electromagnetic radiation reflected from the wafer 32 reaches the alignment optics 37. However, in this case, contours of the 3D structures of the 3D alignment target 35 located at the frontside or inside the wafer 32 are not visible as indicated by the lower part of FIG. 4a.

When illuminating the wafer's backside in the dark-field configuration, as illustrated in FIG. 4b, only electromagnetic radiation scattered at the 3D structures of the 3D alignment target 35 located at the frontside or inside the wafer 32 reaches the alignment optics 37, e.g. a camera. The alignment optics 37 and the wafer 32 are placed such that a direct line 60 from the alignment optics 37 to the alignment target 35 is essentially perpendicular to the plane defined by the wafer 32 placed on the wafer stage 38. According to embodiments, the radiation source 40 is placed relative to the alignment target 35 and the alignment optics 37, such that the alignment target 35 is illuminated with electromagnetic radiation of a specific wavelength λ in an oblique angle α in the range of 5° to 80° (5°≤α≤80°) relative to the plane defined by the wafer 32, and such that no electromagnetic radiation reflected from the wafer 32 reaches the alignment optics 37. Instead, only electromagnetic radiation scattered at the 3D structures of the 3D alignment target 35 located at the frontside or in a predefined circuit layer of the wafer 32 reaches the alignment optics 37. If the radiation source 40, the alignment optics 37 and the 3D alignment target 35 are taken as corners of a triangle, the side "alignment optics 37 to alignment target 35" is, according to an embodiment, perpendicular to the plane defined by the wafer 32. The angle β between the side "alignment optics 37 to alignment target 35" and the side "radiation source 40 to alignment target 35" is β=90°−α, i.e., the angle β is in the range of 85° down to 10° (10°≤β≤85°. In particular, in case angle α is in the range of 45°±10°, the angle β may also be in the range of 45°±10°. Due to this dark-field configuration, images of high contrasts may be obtained from the 3D alignment targets, as illustrated in the lower part of FIG. 4b.

Since typical semiconductor wafer materials, like, e.g., silicon, are transparent to infra-red light, the radiation source 40 may be adapted to illuminate the wafer's backside with electromagnetic radiation in the spectral infra-red range. In particular, the radiation source 40 may be a laser diode for radiating infra-red light at an infra-red wavelength, e.g., λ=980 nm. Also, the radiation source 40 may be adapted to illuminate the wafer's backside with electromagnetic radiation in the spectral THz (Terra-Hertz) range.

Before placing the frontside of the wafer 32 on the wafer chuck 38, the frontside or a predefined circuit layer within the wafer 32 is structured with at least one 3D alignment target 35 that includes a plurality of excavations or depressions in the semiconductor substrate, like, e.g., trenches or holes. Trenches are defined by being deeper than they are wide, and by being narrow compared to their length, as opposed to a hole. In general, the geometry of the 3D alignment target 35 is adapted for scattering the incident electromagnetic radiation coming from the light-source 40 perpendicularly to the wafer 32 towards the alignment optics 37. The more trenches or holes used for the 3D alignment target 35, the better will be the contrast of the resulting alignment image. Processes for structuring trenches or holes in semiconductor substrates are well-known in the art. For example, etching processes for structuring trenches for trench capacitors may be used. For good contrast, however, the structured trenches should not be designed too wide. For maximum contrast in the dark-field image, trenches should be aligned perpendicular to the plane of incidence. Also, the pitch of the trenches used in the alignment structures should be larger than the wavelength of the incident light.

Hence, some embodiments of the present invention also comprise a wafer 32 that includes a structured frontside and a backside, wherein structures of the backside may be aligned to structures of the frontside for a lithographic treatment of the backside, and wherein the wafer 32 is transparent for electromagnetic radiation of a specific wavelength λ, in particular, infra-red light. The wafer 32 comprises at least one 3D alignment target 35 at the frontside or in a layer close to the frontside of the wafer for scattering electromagnetic radiation of a specific wavelength λ reaching the 3D alignment target 35 from the backside of the wafer, such that the electromagnetic radiation is scattered towards the backside of the wafer 32 and the aperture of the alignment optics 37.

According to some embodiments, the at least one 3D alignment target 35 includes a plurality of trenches or holes structured in the semiconductor substrate of the wafer 32, e.g., by an etching process.

Figure 5:
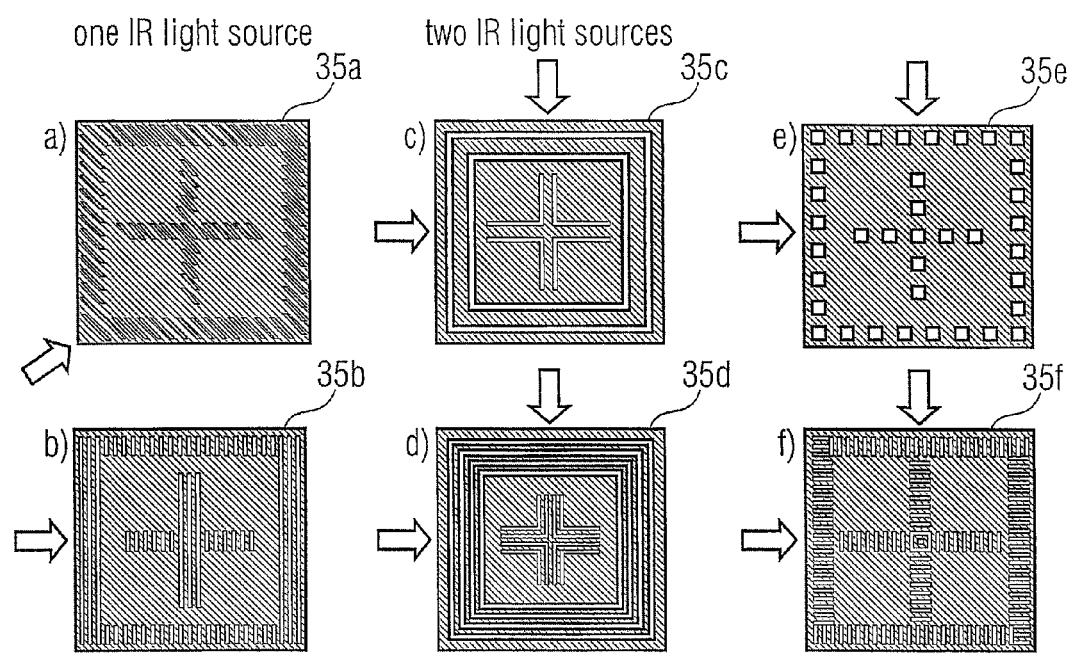
FIG. 5 exemplarily shows a plurality of TVPA targets, according to several embodiments of the present invention, for front-to-backside alignment with electromagnetic radiation in the dark-field configuration.

FIG. 5 exemplarily shows different embodiments of 3D TVPA (TeleVision Pre-Alignment) targets with multiple trenches, which may be etched into the silicon in a predefined depth, and which may be used to enhance the contrast of alignment images.

FIGS. 5a and 5b show framed cross patterns designed for being illuminated with only one light source 40, wherein the 3D alignment targets 35a and 35b are illuminated perpendicular to the orientation of their trench walls. For one light source 40, a plurality of trenches with only one orientation of trench walls is sufficient.

FIGS. 5c to 5f show different 3D TVPAs 35c to 35f designed for an illumination with two light sources, wherein the respective directions of illumination are perpendicular to each other. In this case, the TVPAs include trenches with different orientations of trench walls corresponding to the light sources. In case of perpendicular illumination directions, the trench walls of the plurality of trenches may also be perpendicular to each other.

For the alignment process, a reticle matching the 3D alignment targets 35 has to be applied between the wafer's backside and the alignment optics 37, as has been in principle explained with reference to FIG. 1a. Further, the required electromagnetic illumination, e.g., infra-red light, has to be installed into an existing OEM stepper (Original Equipment Manufacturer). For this reason, laser diodes or glass-fiber coupled IR laser diodes, may be employed as the radiation source 40.

To summarize, the front-to-backside alignment is achieved with the dark-field illumination of the alignment target 35 from the light-source 40 through the wafer 32. In the dark-field configuration, electromagnetic radiation, e.g., infra-red light, illuminates the alignment target 35 at an oblique angle α from the wafer's backside where also the alignment optics 37 of the stepper is located. Due to the dark-field configuration, the alignment optics 37 of the OEM front-to-front alignment stepper detects infra-red light, which is scattered at the 3D features of the alignment target 35, e.g., 3D defects at a silicon boundary surface by means of etched trench structures. Thereby, the infra-red light is scattered perpendicularly or vertically towards the backside and the alignment optics 37 include an infra-red camera. Reflections at the wafer surface, i.e., the backside, are negligible because of the dark-field configuration. According to various embodiments, one or two infra-red light sources 40 may be mounted close to the alignment optics 37 of the OEM front-to-front alignment stepper without additional modifications of hard- and software of the OEM stepper. Light sources may be infra-red laser diodes with collimator optics or glass fiber coupled infra-red laser diodes. Alignment optics 37, hence, may be infra-red cameras coupled to optical analysis equipment 36 which can control the positioning of the wafer stage or chuck 38 on which the substrate or wafer 32 sits by motor stages 39, which, e.g., can move the chuck 38 along the X-axis, Y-axis or the rotational θ-axis as appropriate.

Embodiments of the present invention allow a wafer front-to-backside alignment with an existing OEM front-to-front alignment stepper. Purchase and installation of expensive new steppers may, hence, be avoided.

Although some aspects have been described in the context of an apparatus for aligning structures of a wafer's backside to structures of the wafer's frontside, it is clear that these aspects also represent a description of the corresponding method for aligning structures of a wafer's backside to structures of the wafer's frontside, where a block or device corresponds to a method step or a feature of a method step. Analogously, aspects described in the context of a method step also represent a description of a corresponding block or item or feature of a corresponding apparatus.

The above described embodiments are merely illustrative for the principles of the present invention. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

What is claimed is:

1. A method for aligning structures of a backside of a wafer to structures of a frontside of the wafer for a lithographic treatment of the backside, wherein the wafer is transparent for electromagnetic radiation of a specific wavelength, the method comprising:
    placing the wafer on a wafer stage such that the frontside faces the wafer stage and the backside faces alignment optics;
    illuminating the backside with electromagnetic radiation of the specific wavelength in a dark-field configuration, such that the electromagnetic radiation propagates through the wafer towards three-dimensional structures of individual three-dimensional alignment targets spaced apart from each other and located at the frontside or inside the wafer and is scattered at the three-dimensional structures;
    capturing the scattered electromagnetic radiation with the alignment optics; and
    aligning the backside to the frontside of the wafer based on the scattered electromagnetic radiation,
    wherein an individual three-dimensional alignment target comprises a plurality of parallel trenches having a pitch larger than the specific wavelength, and
    wherein illuminating comprises illuminating the backside under an oblique angle relative to a plane defined by the wafer placed on the wafer stage and illuminating one of the individual three-dimensional alignment targets perpendicular to an orientation of trench walls of the plurality of parallel trenches.

2. The method according to claim 1, wherein the oblique angle is in a range of 5° to 80°.

3. The method according to claim 1, wherein the wafer is placed such that a radiation source, the alignment optics and the one of the individual three-dimensional alignment targets form corners of a triangle, wherein the triangle side from the alignment optics to the one of the individual three-dimensional alignment targets is perpendicular to a plane defined by the wafer, and wherein an angle between the triangle side from the alignment optics to the one of the individual three-dimensional alignment targets and the triangle side from the radiation source to the one of the individual three-dimensional alignment targets is in a range of 10° to 85°.

4. The method according to claim 1, wherein illuminating the backside comprises illuminating the backside with infra-red or THz-radiation.

5. The method according to claim 1, wherein illuminating the backside comprises illuminating the backside with infra-red radiation provided by at least one infra-red laser source.

6. A method for aligning structures of a backside of a wafer to structures of a frontside of the wafer for a lithographic treatment of the backside, wherein the wafer is transparent for infra-red light of a specific wavelength, the method comprising:
    placing the wafer on a wafer stage such that the frontside faces the wafer stage and the backside faces alignment optics;
    illuminating the backside with infra-red light of the specific wavelength in a dark-field configuration, such that the infra-red light propagates through the wafer towards three-dimensional structures of individual three-dimensional alignment targets spaced apart from each other and located at the frontside or inside the wafer and is scattered at the three-dimensional structures towards the backside;
    capturing the scattered infra-red light with the alignment optics; and
    aligning the backside to the frontside of the wafer based on the scattered infra-red light,
    wherein an individual three-dimensional alignment target comprises a plurality of parallel trenches having a pitch larger than the specific wavelength, and
    wherein illuminating comprises illuminating the backside under an oblique angle relative to a plane defined by the wafer placed on the wafer stage and illuminating one of the individual three-dimensional alignment targets perpendicular to an orientation of trench walls of the plurality of parallel trenches.

7. The method according to claim 6, wherein the oblique angle is in a range of 45°±10°.

8. An apparatus for aligning structures of a backside of a wafer to structures of a frontside of the wafer for a lithographic treatment of the backside, wherein the wafer is transparent for electromagnetic radiation of a specific wavelength, the apparatus comprising:
    alignment optics for capturing electromagnetic radiation from three-dimensional structures of individual three-dimensional alignment targets spaced apart from each other and located at the frontside or inside the wafer;
    a wafer stage for carrying the wafer such that the frontside is facing the wafer stage and the backside is facing the alignment optics; and
    a radiation source for illuminating the backside with electromagnetic radiation of the specific wavelength in a dark-field configuration, such that the electromagnetic radiation propagates through the wafer towards the three-dimensional structures of three-dimensional alignment targets located at the frontside or the inside the wafer and is scattered at the three-dimensional structures, wherein the structures of the backside can be aligned to the structures of the frontside of the wafer based on the scattered electromagnetic radiation captured with the alignment optics, wherein an individual three-dimensional alignment target comprise a plurality of parallel trenches having a pitch larger than the specific wavelength, and wherein the radiation source is configured to illuminate the backside under an oblique angle relative to a plane defined by the wafer placed on the wafer stage, and to illuminate one of the individual three-dimensional alignment targets perpendicular to an orientation of trench walls of the plurality of parallel trenches.

9. The apparatus according to claim 8, wherein the radiation source is configured to illuminate the backside in an oblique angle in a range of 5° to 80°.

10. The apparatus according to claim 8, wherein the radiation source, the alignment optics and the one of the individual three-dimensional alignment targets form corners of a triangle, wherein the triangle side from the alignment optics to the one of the individual three-dimensional alignment targets is perpendicular to a plane defined by the wafer, and wherein an angle between the triangle side from the alignment optics to the one of the individual three-dimensional alignment targets and the triangle side from the radiation source to the one of the individual three-dimensional alignment targets is in a range of 10° to 85°.

11. The apparatus according to claim 8, wherein the radiation source comprises an infra-red laser source.

12. An apparatus for aligning structures of a backside of a wafer to structures of a frontside of the wafer for a lithographic treatment of the backside, wherein the wafer is transparent for infra-red light of a specific wavelength, the apparatus comprising:

an infra-red camera for capturing infra-red light from three-dimensional structures of individual three-dimensional alignment targets spaced apart from each other and located at the frontside or inside the wafer;

a wafer stage for carrying the wafer such that the frontside is facing the wafer stage and the backside is facing alignment optics; and an infra-red light source for illuminating the backside with infra-red light of the specific wavelength in a dark-field configuration, such that the infra-red light propagates through the wafer towards the three-dimensional structures of three-dimensional alignment targets located at the frontside or inside the wafer and is scattered at the three-dimensional alignment targets towards the infra-red camera, wherein the structures of the backside can be aligned to the structures of the frontside of the wafer based on the scattered infra-red light captured with the infra-red camera, wherein an individual three-dimensional alignment target comprise a plurality of parallel trenches having a pitch larger than the specific wavelength, and wherein the infra-red light source is configured to illuminate the backside under an oblique angle relative to a plane defined by the wafer placed on the wafer stage and to illuminate one of the individual three-dimensional alignment targets perpendicular to an orientation of trench walls of the plurality of parallel trenches.

13. The apparatus according to claim 12, wherein the infra-red light source is configured to illuminate at least a part of the backside in an oblique angle in a range of 45°±10°.

14. The apparatus according to claim 12, wherein the infra-red light source, the infra-red camera and the one of the individual three-dimensional alignment targets form corners of a triangle, wherein the triangle side from the infra-red camera to the one of the individual three-dimensional alignment targets is perpendicular to a plane defined by the wafer, and wherein an angle between the triangle side from the infra-red camera to the one of the individual three-dimensional alignment targets and the triangle side from the infra-red light source to the one of the individual three-dimensional alignment targets is in a range of 10° to 85°.

15. A method for aligning structures of a backside of a wafer to structures of a frontside of the wafer, the method comprising:

providing the wafer, the wafer having a backside facing alignment optics;

illuminating the backside with electromagnetic radiation in a dark-field configuration, the wafer being transparent to the electromagnetic radiation, the electromagnetic radiation propagating through the wafer towards three-dimensional structures of individual three-dimensional alignment targets spaced apart from each other and located at the frontside or inside the wafer and scattering at the three-dimensional structures; and capturing the scattered electromagnetic radiation with the alignment optics, wherein an individual three-dimensional alignment target comprise a plurality of parallel trenches having a pitch larger than a wavelength of the electromagnetic radiation, and wherein illuminating comprises illuminating the backside under an oblique angle relative to a plane defined by the wafer and illuminating one of the individual three-dimensional alignment targets perpendicular to an orientation of trench walls of the plurality of parallel trenches.

16. A method for aligning structures of a backside of a wafer to structures of a frontside of the wafer, comprising:

providing the wafer, the wafer having a backside facing alignment optics;

illuminating the backside with infra-red light in a dark-field configuration, the wafer being transparent to the infra-red light, the infra-red light propagating through the wafer towards three-dimensional structures of individual three-dimensional alignment targets spaced apart from each other and located at the frontside or inside the wafer and scattering at the three-dimensional structures towards the backside; and capturing the scattered infra-red light with the alignment optics, wherein an individual three-dimensional alignment target comprise a plurality of parallel trenches having a pitch larger than a wavelength of the infra-red light, and wherein illuminating comprises illuminating the backside under an oblique angle relative to a plane defined by the wafer and illuminating one of the individual three-dimensional alignment targets perpendicular to an orientation of trench walls of the plurality of parallel trenches.

17. An apparatus for aligning structures of a backside of a wafer to structures of a frontside of the wafer, comprising:

alignment optics for capturing electromagnetic radiation from three-dimensional structures of individual three-dimensional alignment target targets spaced apart from each other and located at the frontside or inside the wafer;

a wafer stage for carrying the wafer such that the frontside is facing the wafer stage and the backside is facing the alignment optics; and a radiation source for illuminating the backside with electromagnetic radiation in a dark-field configuration, the wafer being transparent to the electromagnetic radiation, the electromagnetic radiation propagating through the wafer towards three-dimensional structures of a three-dimensional alignment target located at the frontside or inside the wafer and scattering at the three-dimensional structures, wherein the alignment optics is adapted to capture the scattered electromagnetic radiation, wherein an individual three-dimensional alignment target comprise a plurality of parallel trenches having a pitch larger than a wavelength of the electromagnetic radiation, and wherein the radiation source is configured to illuminate the backside under an oblique angle relative to a plane defined by the wafer placed on the wafer stage, and to illuminate one of the individual three-dimensional alignment targets perpendicular to an orientation of trench walls of the plurality of parallel trenches.

18. An apparatus for aligning structures of a backside of a wafer to structures of a frontside of the wafer, comprising:

alignment optics for capturing infra-red light from three-dimensional structures of a three-dimensional alignment target located at the frontside or inside the wafer;

a wafer stage for carrying the wafer such that the frontside is facing the wafer stage and the backside is facing the alignment optics; and a radiation source for illuminating the backside with infra-red light in a dark-field configuration, the wafer being transparent to the infra-red light, the infra-red light propagating through the wafer towards three-dimensional structures of individual three-dimensional alignment targets spaced apart from each other and located at the frontside or inside of the wafer and scattering at the three-dimensional structures towards the backside, wherein the alignment optics is adapted to capture the scattered infra-red light, wherein an individual three-dimensional alignment target comprise a plurality of parallel trenches having a pitch larger than a wavelength of the infra-red light, and wherein the radiation source is configured to illuminate the backside under an oblique angle relative to a plane defined by the wafer placed on the wafer stage, and to illuminate one of the individual three-dimensional alignment targets perpendicular to an orientation of trench walls of the plurality of parallel trenches.

* * * * *